US007038503B2

(12) United States Patent
Wei

(10) Patent No.: US 7,038,503 B2
(45) Date of Patent: May 2, 2006

(54) DRIVING CIRCUIT FOR ELECTRICAL NAILING GUN

(75) Inventor: Chen-Ku Wei, Nantou County (TW)

(73) Assignee: Mobiletron Electronics Co., Ltd., Taichung Hsien (TW)

( * ) Notice: Subject to any disclaimer, the term of this patent is extended or adjusted under 35 U.S.C. 154(b) by 12 days.

(21) Appl. No.: 10/885,603

(22) Filed: Jul. 8, 2004

(65) Prior Publication Data

US 2006/0006911 A1 Jan. 12, 2006

(51) Int. Cl.
*H03B 1/00* (2006.01)

(52) U.S. Cl. ........................ 327/110; 327/453; 327/455

(58) Field of Classification Search ................ 327/110, 327/445–446, 452–453, 455, 460, 476, 468–469
See application file for complete search history.

(56) References Cited

U.S. PATENT DOCUMENTS

| | | | | |
|---|---|---|---|---|
| 5,633,779 | A * | 5/1997 | Knoble et al. | 361/187 |
| 6,249,103 | B1 * | 6/2001 | Alvaro et al. | 318/700 |
| 6,329,784 | B1 * | 12/2001 | Puppin et al. | 318/778 |
| 6,356,038 | B1 * | 3/2002 | Bishel | 315/291 |
| 6,674,248 | B1 * | 1/2004 | Newman et al. | 315/247 |
| 6,784,622 | B1 * | 8/2004 | Newman et al. | 315/219 |
| 6,880,740 | B1 * | 4/2005 | Lu | 227/131 |

* cited by examiner

*Primary Examiner*—My-Trang Nu Ton
(74) *Attorney, Agent, or Firm*—Bacon & Thomas, PLLC

(57) ABSTRACT

A driving circuit for electrical nailing gun is disclosed to include a capacitive charging/discharging unit formed of a first resistor, a first diode, and a capacitor connected in series and connected with two opposite ends thereof to the positive and negative poles of AC power source, an excited field unit formed of a first coil and a first electrically-controlled switch connected in series and having two opposite ends connected in parallel to the capacitor, and a control unit electrically connected to the first electrically-controlled switch for activating the first electrically-controlled switch.

9 Claims, 8 Drawing Sheets

DRIVING CIRCUIT FOR ELECTRICAL NAILING GUN

BACKGROUND OF THE INVENTION

1. Field of the Invention

The present invention relates generally to an electrical nailing gun, and more specifically to a driving circuit for an electrical nailing gun, which uses a capacitor to accumulate electrical energy for increasing the power of the electrical nailing gun.

2. Description of the Related Art

Conventionally, high power nailing guns are air nailing guns to be used with an air compressor to fire nails. However, an air nailing gun produces much noise during operation. Further, the air compressor requires much work space. In order to eliminate these drawbacks, electrical nailing guns are developed. An electrical nailing gun uses electricity to energize a coil, thereby producing a magnetic force to attract the piston, and therefore the piston drives the nail into the workpiece. This design of electrical nailing gun produces low noise during operation. Because this design of electrical nailing gun does not use with an air compressor, it requires less work space. However, conventional electrical nailing guns still have drawbacks. A conventional electrical nailing gun requires a heavy transient current when firing the nail, and such a heavy transient current is a heavy burden to the AC power cord. Different AC power cord conditions, such as wire diameter, power cord extension length, or power cord material, cause different transient current to further result in different firing power. Due to the limitation of firing power, there is a limitation to the application of conventional electrical nailing guns, thereby resulting in a barrier to market promotion.

FIG. 7 is a circuit diagram of a driving circuit for electrical nailing gun according to the prior art. According to this design, the driving circuit is a single coil driving circuit where only one half-cycle of AC power source is electrically connected upon each firing action. FIG. 8 is a circuit diagram of another design of driving circuit for electrical nailing gun according to the prior art. According to this design, the driving circuit is a bi-coil driving circuit where AC power source positive half-cycle and AC power source negative half-cycle are respectively applied on two coils that are connected in series. The two coils accelerate the piston, thereby increasing the firing power.

The driving circuit of a conventional electrical nailing gun simply uses one half-cycle or one full-cycle. However, the frequency of city power supply is 60 Hz, and the period of a half-cycle is as short as 8.3 ms. This short period results in a limitation to the action of the magnetic force upon the piston. Because magnetic force varies with the variation of AC power supply waveform, the magnetic force converted from the electrical energy for attracting the piston cannot be optimized, i.e., the piston firing power is limited. Further, in order to increase magnetic force, electrical current must be relatively increased. However, increasing electrical current may cause an overload at the AC power cord, thereby resulting in flashing of fluorescent lamps in the house. Furthermore, if the resistance is increased due to the use of an electrical extension cable, the energizing current will drop, thereby reducing nail firing power. Therefore, the use of an electrical extension cable is limited. Further, if three or more coils are used to increase nail firing power, the length of the electrical nailing gun must be relatively increased, and the weight of the electrical nailing gun will be relatively increased. Further, because every coil works at a saturated status, the temperature of the electrical nailing gun will be greatly increased, not able to meet safety code (for example, UL) requirements.

SUMMARY OF THE INVENTION

The present invention has been accomplished under the circumstances in view. It is therefore the main object of the present invention to provide a driving circuit for electrical nailing gun, which greatly increases nail firing power without increasing the electrical current.

To achieve this and other objects of the present invention, the driving circuit for electrical nailing gun comprises a capacitive charging/discharging unit, the capacitive charging/discharging unit comprising a first resistor, a first diode, and a capacitor connected in series, the capacitive charging/discharging unit having two opposite ends respectively connected to the positive and negative poles of AC power source; an excited field unit, the excited field unit comprising a first coil and a first electrically-controlled switch connected in series, the first coil having two opposite ends connected in parallel to the capacitor; and a control unit electrically connected to the first electrically-controlled switch for activating the first electrically-controlled switch.

DETAILED DESCRIPTION OF THE INVENTION

Figure 1:
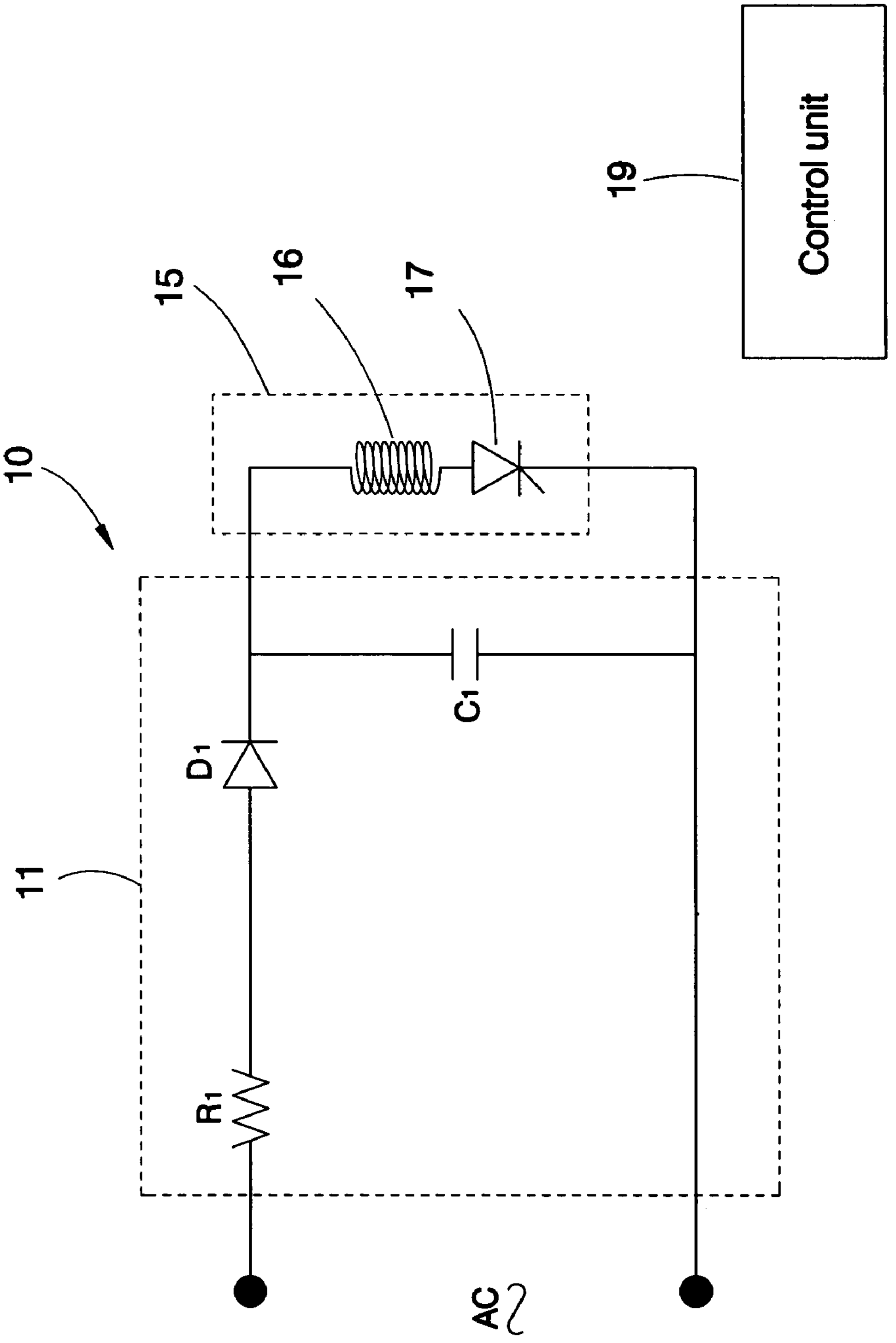
FIG. 1 is a circuit diagram of a driving circuit for electrical nailing gun according to the first embodiment of the present invention.

Referring to FIG. 1, a driving circuit for electrical nailing gun 10 is shown comprised of a capacitive charging/discharging unit 11, an excited field unit 15, and a control unit 19.

The capacitive charging/discharging unit 11 comprises a first resistor R1, a first diode D1, and a capacitor C1 connected in series. The capacitive charging/discharging unit 11 has two ends respectively connected to two ends of AC power source.

The excited field unit 15 comprises a first coil 16 and a first electrically-controlled switch 17 connected in series. The excited field unit 15 has two ends connected in parallel to the capacitor C1. The first electrically-controlled switch 17 according to this embodiment is a SCR (silicon-controlled rectifier).

The control unit 19 is electrically connected to the first electrically-controlled switch 17 for activating the first electrically-controlled switch 17.

Upon connection of the electrical nailing gun (not shown) to AC power source, the control unit 19 deactivated the first electrically-controlled switch 17. At this time, AC positive half-cycle passes through the first resistor R1 and the first diode D1 to charge the capacitor C1 to the saturated standby status. Thus, the control unit 19 sends a signal to activate the first electrically-controlled switch 17 when received a triggering signal (firing signal), i.e., at the proper time corresponding to AC power source, wherein the first electrically-controlled switch 17 is activated during positive half-cycle of AC power source, and closed during negative half-cycle of AC power source. The capacitor C1 discharges when the first electrically-controlled switch 17 is activated, thereby increasing current to the first coil 16 to enhance the nail firing force.

Figure 2:
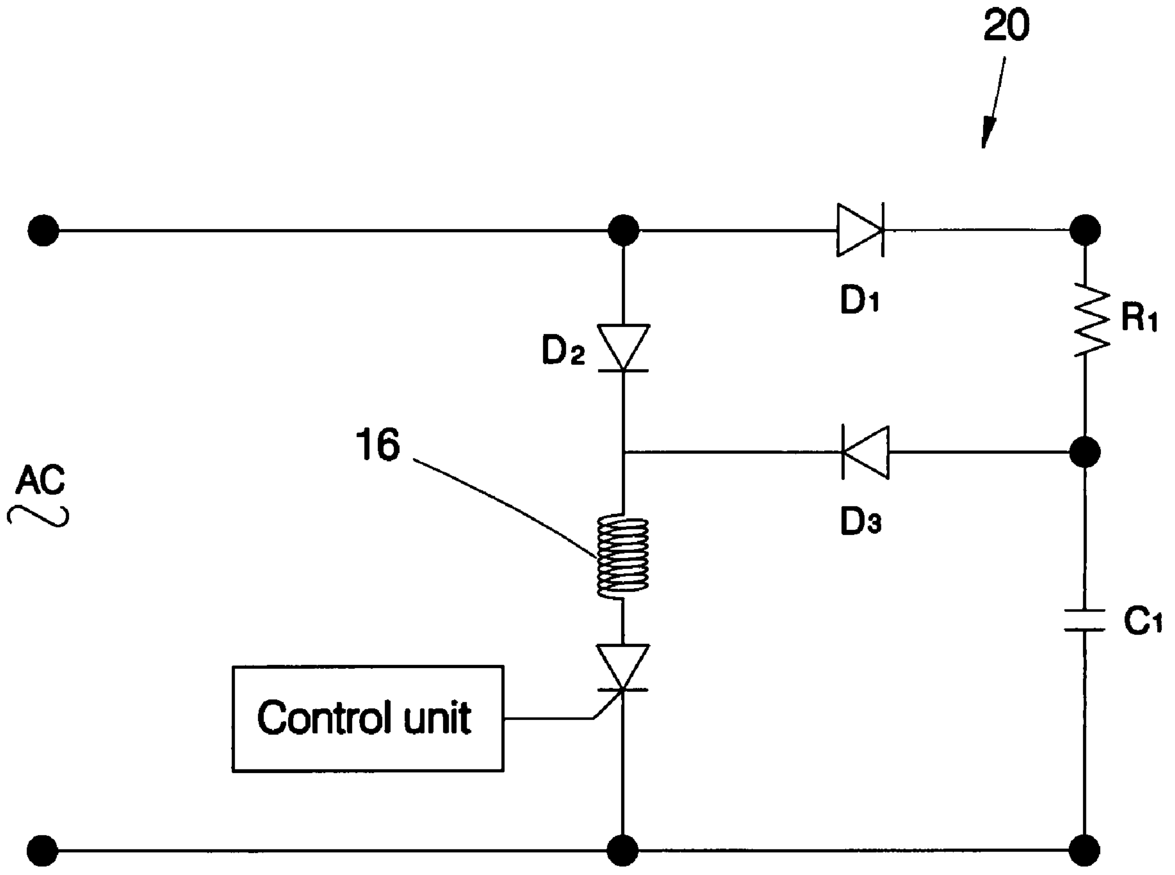
FIG. 2 is a circuit diagram of a driving circuit for electrical nailing gun according to the second embodiment of the present invention.

FIG. 2 illustrates a driving circuit for electrical nailing gun according to the second embodiment of the present invention. According to this embodiment, the driving circuit 20 further comprises a second diode D2 and a third diode D3. The positive and negative poles of the second diode D2 are respectively connected to the positive pole of the first diode D1 and the first coil 16. The positive and negative poles of the third diode D3 are respectively connected to one end of the capacitor C1 and one end of the first coil 16.

During operation, the second diode D2 and the third diode D3 are used to guide the direction of current. Same as the aforesaid first embodiment of the present invention, the discharging operation of the capacitor C1 is used to increase the current of the first coil 16, thereby enhancing the nail firing force.

Figure 3:
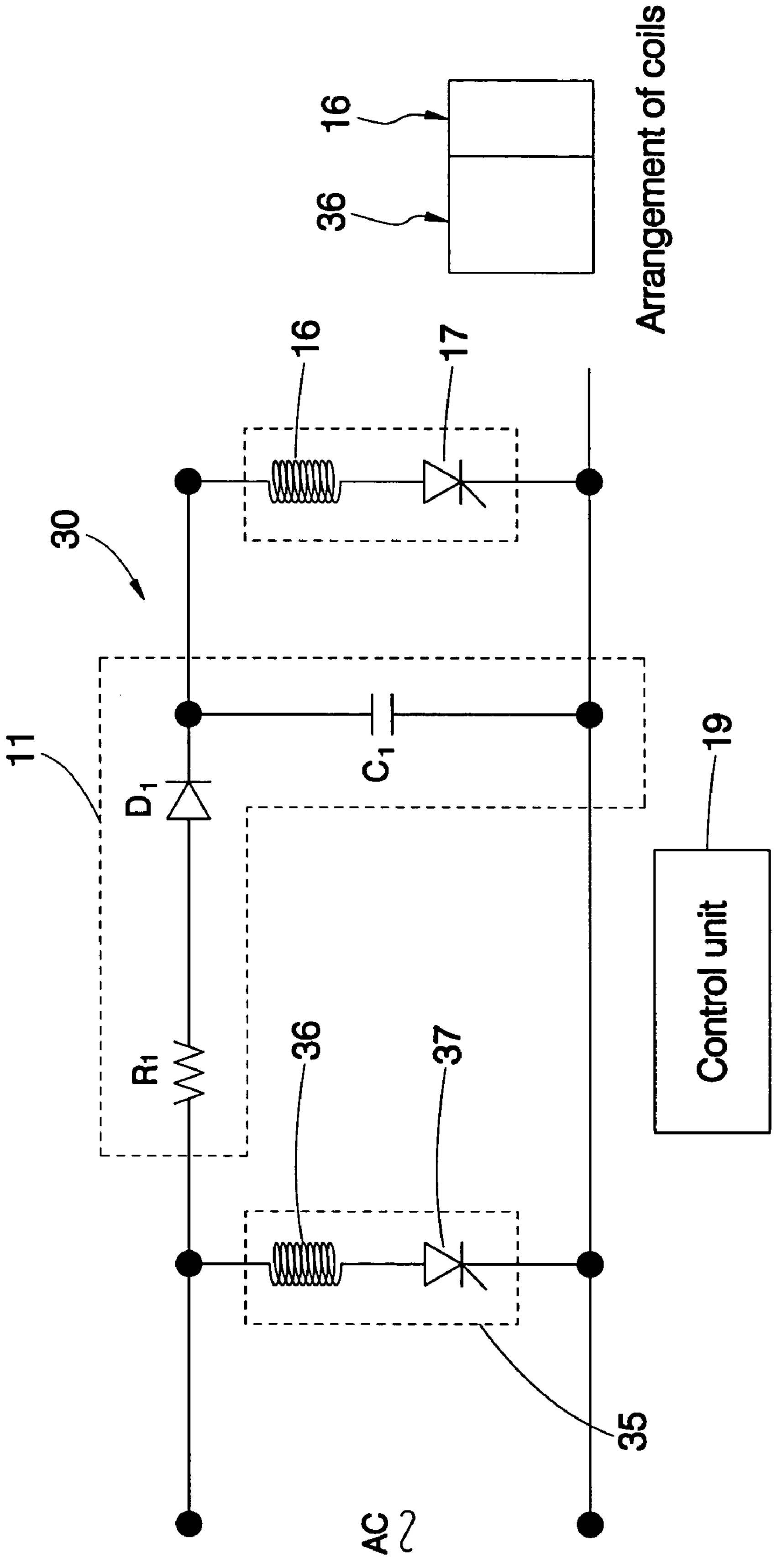
FIG. 3 is a circuit diagram of a driving circuit for electrical nailing gun according to the third embodiment of the present invention.

FIG. 3 illustrates a driving circuit for electrical nailing gun according to the third embodiment of the present invention. This embodiment is substantially similar to the aforesaid first embodiment of the present invention, however the driving circuit 30 of this third embodiment further comprises an AC power source positive half-cycle excited field unit 35, which is comprised of a second coil 36 and a second electrically-controlled switch 37 connected in series. The second electrically-controlled switch 37 according to this embodiment is a SCR (silicon-controlled rectifier). The two ends of the AC power source positive half-cycle excited field unit 35 are connected in parallel to the capacitive charging/discharging unit 11.

When in use, the first coil 16 and the second coil 36 are connected in series. During AC power source positive half-cycle, the control unit 19 activates the second electrically-controlled switch 37, enabling AC power source positive half-cycle to energize the second coil 36. During AC power source negative half-cycle, the control unit 19 activates the first electrically-controlled switch 17, enabling the discharging action of the capacitor C1 to increase the current of the first coil 16 and to further accelerate the nail firing action of the electrical nailing gun. The accelerating effect of these two coils 16 and 36 is much better than the accelerating effect of one single coil. The other operation of this third embodiment is same as the aforesaid first embodiment of the present invention; therefore no further detailed description is necessary.

Figure 4:
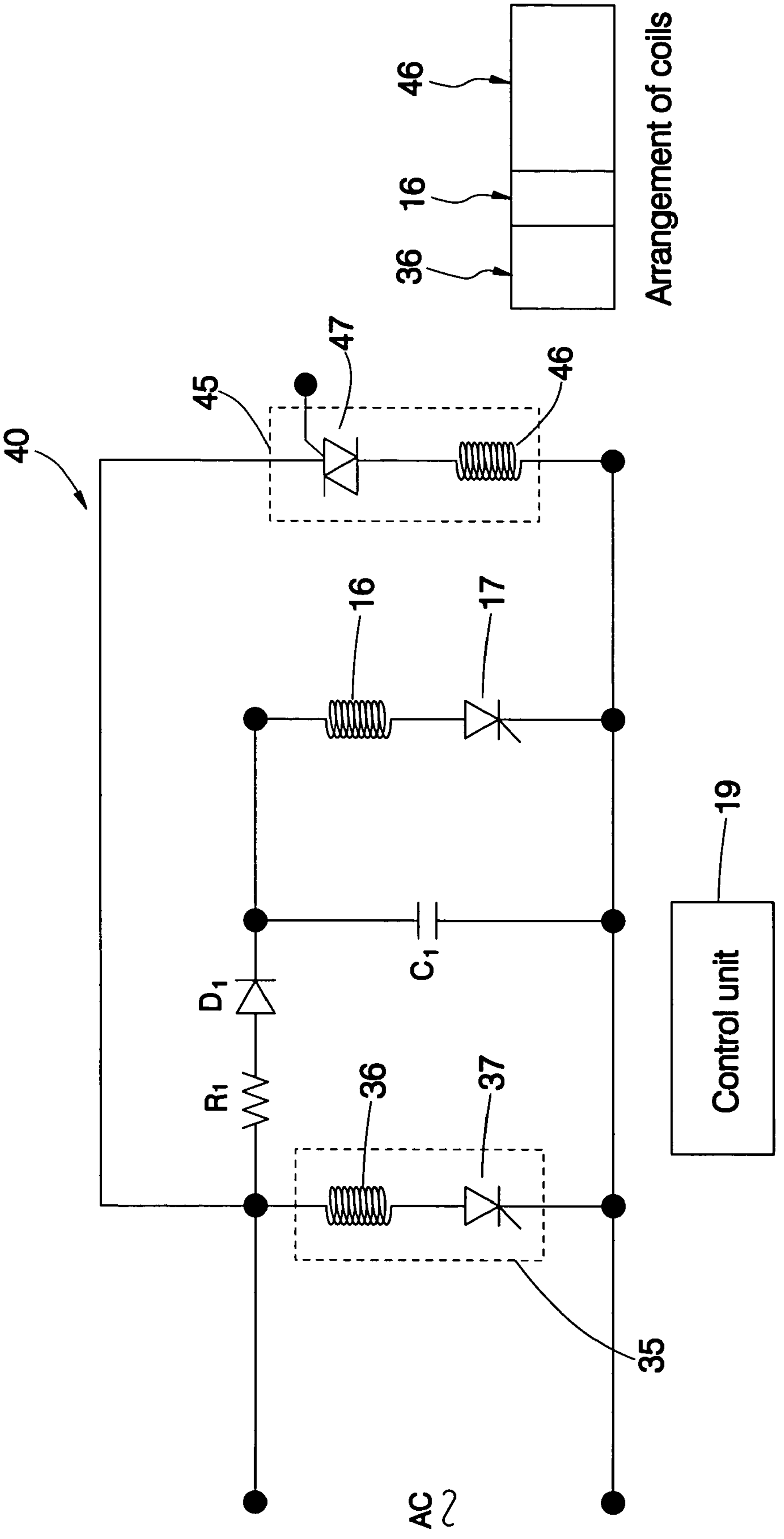
FIG. 4 is a circuit diagram of a driving circuit for electrical nailing gun according to the fourth embodiment of the present invention.

FIG. 4 illustrates a driving circuit for electrical nailing gun according to the fourth embodiment of the present invention. This embodiment is substantially similar to the aforesaid third embodiment of the present invention, however the driving circuit 40 of this fourth embodiment further comprises an AC power source negative half-cycle excited field unit 45, which is comprised of a third coil 46 and a third electrically-controlled switch 47 connected in series. According to this embodiment, the third electrically-controlled switch 47 is a TRIAC. The two ends of the AC power source negative half-cycle excited field unit 45 are connected in parallel to the AC power source positive half-cycle excited field unit 35. According to this embodiment, the second coil 36, the first coil 16 and the third coil 46 are properly connected in series.

When in use, the control unit 19 activates the second electrically-controlled switch 37, the first electrically-controlled switch 17, and the third electrically-controlled switch 47 at proper time, enabling AC power source positive half-cycle to energize the second coil 36 and the first coil 16 and AC power source negative half-cycle to energize the third coil 46. The accelerating effect of this fourth embodiment is much better than the accelerating effect of the aforesaid third embodiment. The other operation of this fourth embodiment is same as the aforesaid first embodiment of the present invention; therefore no further detailed description is necessary.

Figure 5:
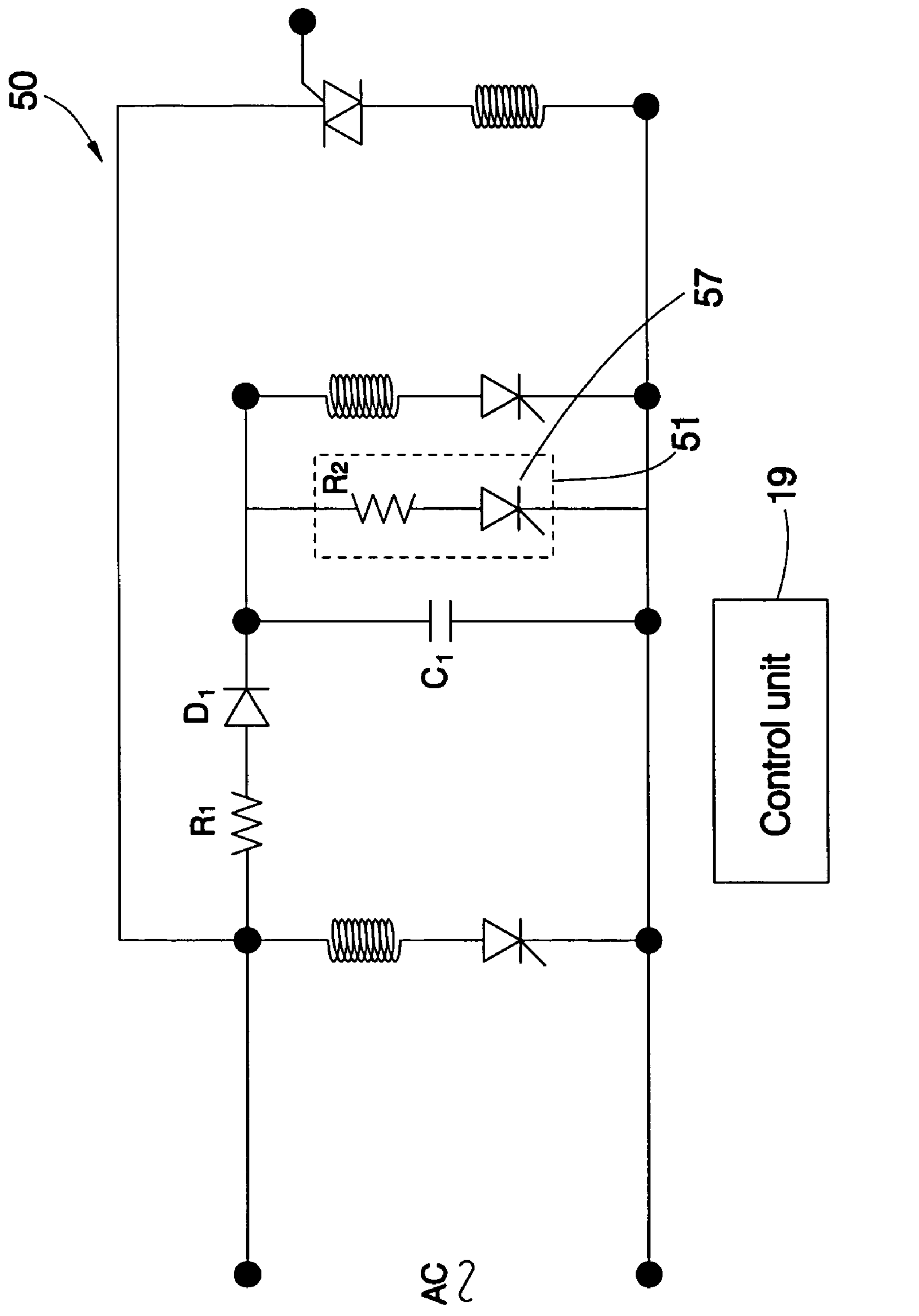
FIG. 5 is a circuit diagram of a driving circuit for electrical nailing gun according to the fifth embodiment of the present invention.

FIG. 5 illustrates a driving circuit for electrical nailing gun according to the fifth embodiment of the present invention. This embodiment is substantially similar to the aforesaid fourth embodiment of the present invention, however the driving circuit 50 of this fifth embodiment further comprises a discharging unit 51, which is comprised of a second resistor R2 and a fourth electrically-controlled switch 57 connected in series. The two ends of the discharging unit 51 are connected in parallel to the capacitor C1. After the control unit 19 activates the fourth electrically-controlled switch 57, the residual electricity is released from the capacitor C1 through the second resistor R2, preventing a triggering action accidentally. The other operation of this fifth embodiment is same as the aforesaid first embodiment of the present invention; therefore no further detailed description is necessary.

Figure 6:
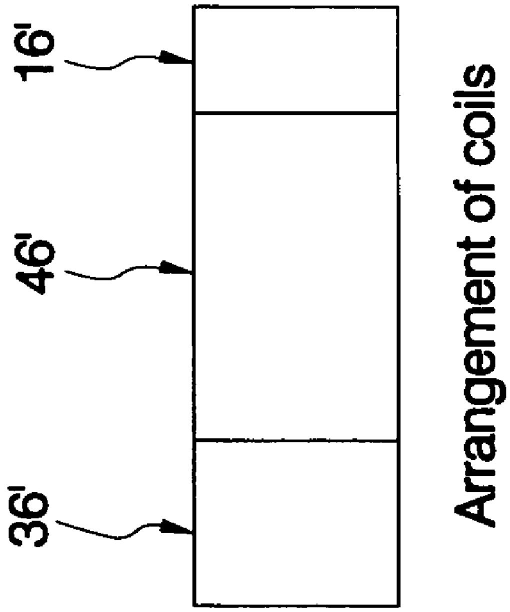
FIG. 6 illustrates an alternate form of the arrangement of the three coils according to the present invention.
Figure 7:
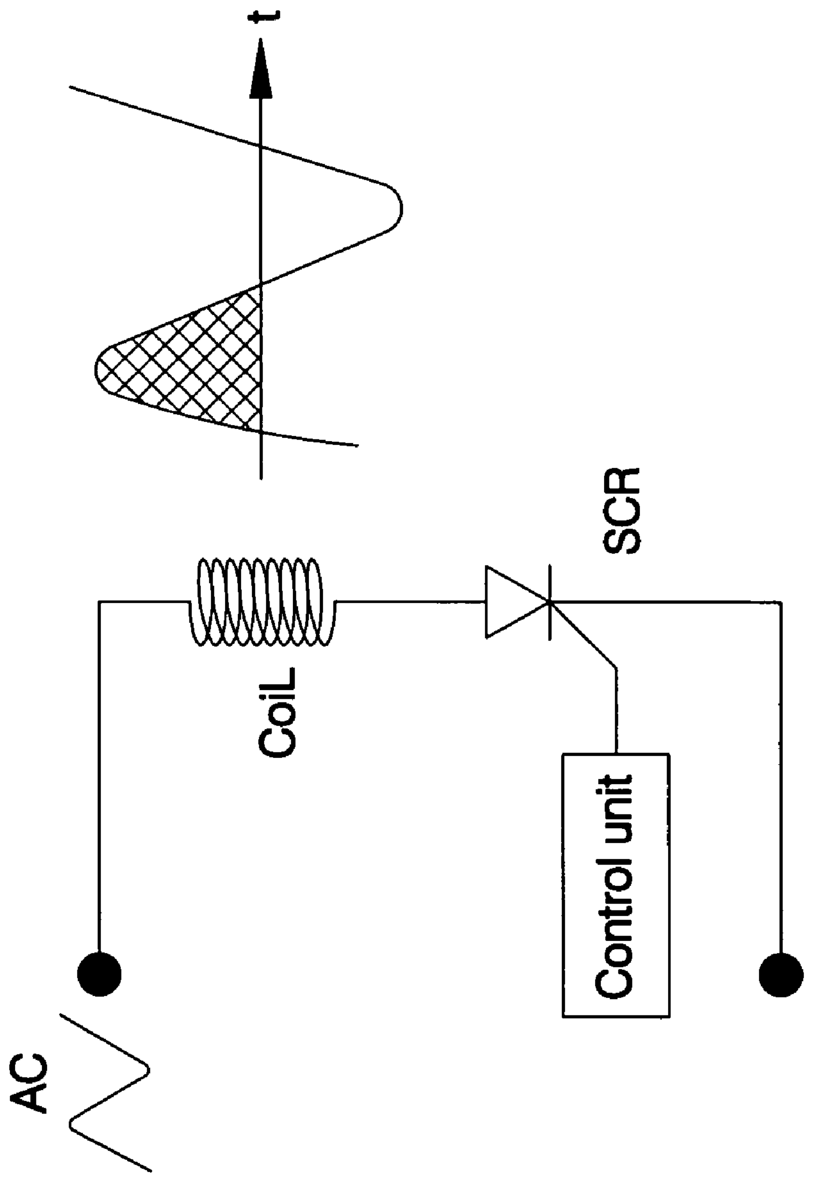
FIG. 7 PRIOR ART
FIG. 7 is a circuit diagram of a driving circuit for electrical nailing gun according to the prior art.
Figure 8:
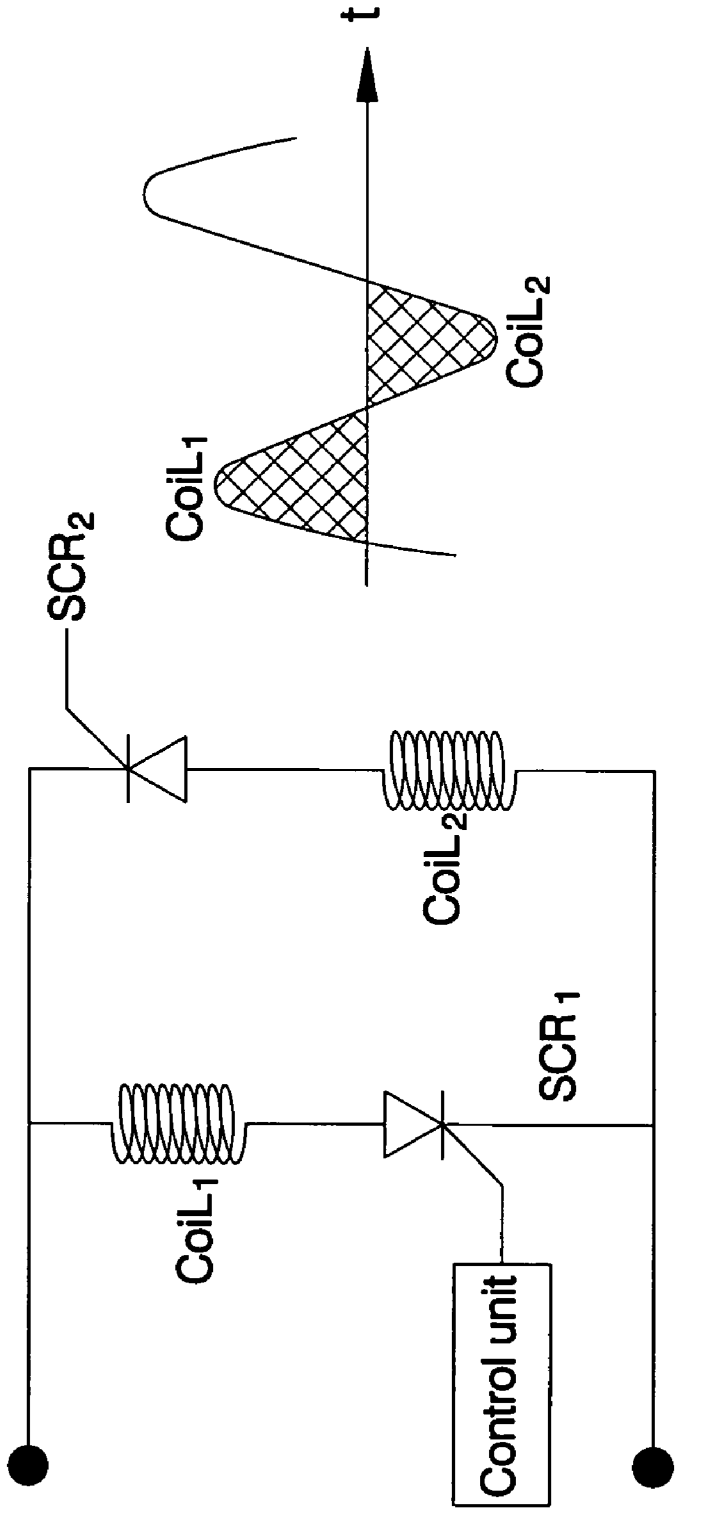
FIG. 8 PRIOR ART
FIG. 8 is a circuit diagram of another design of driving circuit for electrical nailing gun according to the prior art.

According to the aforesaid fourth embodiment as shown in FIG. 4, the three coils are arranged in such a manner that the first coil 16 is connected in series between the second coil 36 and the third coil 46. FIG. 6 shows an alternate form of the arrangement of the three coils. According to this embodiment, the third coil 46' is connected in series between the second coil 36' and the first coil 16'.

As indicated above, the invention uses a capacitive charging/discharging unit to provide an added coil accelerating effect that fully utilizes every full cycle of AC power source. Therefore, the invention greatly enhances the nail firing power without increasing AC power source. Further, the invention uses a capacitor providing electricity, thereby increasing the current of a coil. Due to coils is energized during unsaturated status, the invention achieves a high performance without increasing much temperature. Therefore, the invention can greatly increase nail firing power without changing the total weight and length of the electrical nailing gun and producing much heat.

A prototype of driving circuit for electrical nailing gun has been constructed with the features of FIGS. 1–6. The driving circuit for electrical nailing gun functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A driving circuit for electrical nailing gun comprising:

a capacitive charging/discharging unit, said capacitive charging/discharging unit comprising a first resistor, a first diode, and a capacitor connected in series, said capacitive charging/discharging unit having two opposite ends respectively connected to two ends of an AC power source;

an excited field unit, said excited field unit comprising a first coil and a first electrically-controlled switch connected in series, said first coil having two opposite ends connected in parallel to said capacitor;

a second diode, said second diode having the positive terminal thereof connected to the positive terminal of said first diode and the negative terminal thereof connected to said first coil;

a third diode, said third diode having the positive terminal thereof connected to said capacitor and the negative terminal thereof connected to said first coil; and a control unit electrically connected to said first electrically-controlled switch for activating said first electrically-controlled switch.

2. The driving circuit for electrical nailing gun as claimed in claim 1, wherein said electrically-controlled switch is a silicon-controlled rectifier (SCR).

3. A driving circuit for electrical nailing gun comprising:

a capacitive charging/discharging unit, said capacitive charging/discharging unit comprising a first resistor, a first diode, and a capacitor connected in series, said capacitive charging/discharging unit having two opposite ends respectively connected to two ends of an AC power source;

an excited field unit, said excited field unit comprising a first coil and a first electrically-controlled switch connected in series, said first coil having two opposite ends connected in parallel to said capacitor;

a control unit electrically connected to said first electrically-controlled switch for activating said first electrically-controlled switch; and an AC power source positive half-cycle excited field unit, said AC power source positive half-cycle excited field unit comprising a second coil and a second electrically-controlled switch connected in series, said AC power source positive half-cycle excited field unit having two opposite ends connected in parallel to said capacitive charging/discharging unit.

4. The driving circuit for electrical nailing gun as claimed in claim 3, wherein said first and second electrically-controlled switches are a silicon-controlled rectifiers (SCR).

5. A driving circuit for electrical nailing gun comprising:

a capacitive charging/discharging unit, said capacitive charging/discharging unit comprising a first resistor, a first diode, and a capacitor connected in series, said capacitive charging/discharging unit having two opposite ends respectively connected to two ends of an AC power source;

an excited field unit, said excited field unit comprising a first coil and a first electrically-controlled switch connected in series, said first coil having two opposite ends connected in parallel to said capacitor;

a control unit electrically connected to said first electrically-controlled switch for activating said first electrically-controlled switch; and an AC power source negative half-cycle excited field unit, said AC power source negative half-cycle excited field unit comprising a third coil and a third electrically-controlled switch connected in series, said AC power source negative half-cycle excited field unit having two opposite ends connected in parallel to said capacitive charging/discharging unit and an AC power source positive half-cycle excited field unit.

6. The driving circuit for electrical nailing gun as claimed in claim 5, wherein said first coil is connected in series with said third coil.

7. The driving circuit for electrical nailing gun as claimed in claim 5, further comprising a discharging unit, said discharging unit comprising a second resistor and a fourth electrically-controlled switch connected in series, said discharging unit having two opposite ends connected in parallel to said capacitor.

8. The driving circuit for electrical nailing gun as claimed in claim 5, wherein said third electrically-controlled switch is a TRIAC.

9. The driving circuit for electrical nailing gun as claimed in claim 5, wherein said first electrically-controlled switch is a silicon-controlled rectifier (SCR).

* * * * *